United States Patent
Cole

(10) Patent No.: US 7,196,790 B2
(45) Date of Patent: Mar. 27, 2007

(54) MULTIPLE WAVELENGTH SPECTROMETER

(75) Inventor: Barrett E. Cole, Bloomington, MN (US)

(73) Assignee: Honeywell International Inc., Morristown, NJ (US)

(*) Notice: Subject to any disclaimer, the term of this patent is extended or adjusted under 35 U.S.C. 154(b) by 390 days.

(21) Appl. No.: 10/748,397

(22) Filed: Dec. 30, 2003

(65) Prior Publication Data

US 2004/0218187 A1    Nov. 4, 2004

Related U.S. Application Data

(63) Continuation-in-part of application No. 10/100,298, filed on Mar. 18, 2002, now Pat. No. 7,015,457.

(51) Int. Cl.
*H01J 40/14* (2006.01)

(52) U.S. Cl. .................. 356/326; 250/226; 356/519

(58) Field of Classification Search ............... 356/320, 356/326, 419, 425, 416, 451, 454, 519; 250/226; 257/432
See application file for complete search history.

(56) References Cited

U.S. PATENT DOCUMENTS

| | | | |
|---|---|---|---|
| 4,614,961 A | 9/1986 | Khan et al. | |
| 4,752,694 A | 6/1988 | Hegel, Jr. et al. | |
| 4,754,139 A | 6/1988 | Ennulat et al. | |
| 4,956,555 A * | 9/1990 | Woodberry | 250/339.02 |
| 4,956,686 A | 9/1990 | Borrello et al. | |
| 5,021,663 A | 6/1991 | Hornbeck | |
| 5,076,097 A | 12/1991 | Zarrin et al. | |
| 5,146,465 A | 9/1992 | Khan et al. | |
| 5,278,435 A | 1/1994 | Van Hove | |
| 5,286,976 A | 2/1994 | Cole | |
| 5,293,041 A | 3/1994 | Kruse, Jr. | |
| 5,300,777 A | 4/1994 | Goodwin | |
| 5,300,915 A | 4/1994 | Higshi et al. | |
| 5,550,373 A | 8/1996 | Cole et al. | |
| 5,677,538 A | 10/1997 | Moustakas et al. | |
| 5,679,965 A | 10/1997 | Schetzina | |
| 5,701,012 A | 12/1997 | Ho | |

(Continued)

FOREIGN PATENT DOCUMENTS

EP    0177918    4/1986

(Continued)

OTHER PUBLICATIONS

Agashe, et al., "Thermodynamics of the Complex Protein Unfolding Reaction of Barstar," Biochemistry, 36, pp. 12288-12295, 1997.

(Continued)

*Primary Examiner*—Layla G. Lauchman
(74) *Attorney, Agent, or Firm*—Kris T. Fredrick

(57) ABSTRACT

Multiple wavelength spectrometers can be tuned to particular wavelengths. A dual wavelength spectrometer can include a spectrometer configured to detect at least some wavelengths that fall within the ultraviolet (UV) spectrum and a spectrometer configured to detect at least some wavelengths that fall within the visible spectrum. In some embodiments, a UV light spectrometer and a visible light spectrometer are disposed adjacent one another on a single substrate. A dual wavelength spectrometer can be used for analyzing bioaerosols, as well as for numerous other applications.

44 Claims, 11 Drawing Sheets

U.S. PATENT DOCUMENTS

| | | | |
|---|---|---|---|
| 5,739,554 A | 4/1998 | Edmond et al. | |
| 5,834,331 A | 11/1998 | Razeghi | |
| 5,847,397 A | 12/1998 | Moustakas | |
| 5,900,650 A | 5/1999 | Nitta | |
| 5,909,280 A | 6/1999 | Zavracky | |
| 5,999,250 A | 12/1999 | Hairston et al. | |
| 6,080,988 A | 6/2000 | Ishizuya et al. | |
| 6,097,031 A | 8/2000 | Cole | |
| 6,104,074 A * | 8/2000 | Chen | 257/453 |
| 6,147,756 A * | 11/2000 | Zavracky et al. | 356/519 |
| 6,230,572 B1 | 5/2001 | Pui et al. | |
| 6,287,940 B1 | 9/2001 | Cole et al. | |
| 6,295,130 B1 | 9/2001 | Sun et al. | |
| 6,296,779 B1 | 10/2001 | Clark et al. | |
| 6,324,192 B1 | 11/2001 | Tayebati | |
| 6,590,710 B2 | 7/2003 | Hara et al. | |
| 6,707,548 B2 * | 3/2004 | Kreimer et al. | 356/301 |
| 2002/0018385 A1 | 2/2002 | Flanders et al. | |
| 2002/0031155 A1 | 3/2002 | Tayebati et al. | |

FOREIGN PATENT DOCUMENTS

| | | |
|---|---|---|
| EP | 0475525 | 3/1992 |
| EP | 0481552 | 4/1992 |
| EP | 0654826 | 5/1995 |
| EP | 0667548 | 8/1995 |
| EP | 0687923 | 12/1995 |
| EP | 0903615 * | 3/1999 |
| JP | 03252172 | 11/1991 |
| JP | 05095130 | 4/1993 |
| JP | 0728833 | 10/1995 |
| WO | 93/26049 | 12/1993 |
| WO | 97/18589 | 5/1997 |

OTHER PUBLICATIONS

Brown, J. et al., "Visible-Blind UV Digital Camera Based on a 32*32 Array of GAN/AlGAN P-I-N Photodiodes", MRS Internet Journal of Nitride Semiconductor Research, vol. 4S1, Sep. 1999, XP000949328 ISSN: 1092-5783.

Chitica, J., et al., "Monolithic InP-Based Tunable Filter with 10-nm Bandwidth for Optical Data Interconnects in the 1550-nm Band," IEEE Photonics Technology Letters, vol. 11, No. 5, pp. 584-586, May 1999.

Chung, S. W. et al., "Design and fabrication of 10×10 micro-spatial light modulator array for phase and amplitude modulation," Sensors and Actuators, vol. 78 No. 1, pp. 63-70, Jan. 1999.

Cole, et al., "Microscopic Spectroscopy of Optical MEMS Devices," Topic 2 (Materials and Technology), Honeywell Laboratories, 2 page abstract, submitted on or around Dec. 11, 2000.

Gorinstein et al., "Structure characterization of human serum proteins in solution and dry state," J. Peptide Res., 59, pp. 71-78, 2002.

http://particle.tsi.com/, TSI Particle Instruments, 2 pages, printed Dec. 10, 2003.

http://www.crti.drdc-rddc.gc.ca/projects/crti_0011ta_e.html, CRTI 0011TA—Hand-Held Real-Time Biological Agent Detector—CBRN Research . . . , 2 pages, printed Dec. 10, 2003.

http://www.opticsreport.com/content/interview.php?interview_id=3020, Optics Report, 5 pages, printed Dec. 10, 2003.

http://www.suffield.drdc-rddc.gc.ca/ResearchTech/Products/CB_PRODUCTS/RD98002, CIBADS, 5 pages, printed Dec. 10, 2003.

http://www.suffield.drdc-rddc.gc.ca/ResearchTech/Products/CB_PRODUCTS/RD98001, FLAPS, 4 pages, printed Dec. 10, 2003.

http://www.tsi.com/exposure/products/dusttrak/dusttrak.htm, DUSTTRAK Aerosol Monitor Model 8520, 4 pages, printed Dec. 10, 2003.

Jerman, J.H., et al., "A miniature Fabry-Perot interferometer with a corrugated silicon diaphragm support," Sensors and Actuators, vol. 129, No. 2, pp. 151-158, Nov. 1991.

Johnson-Winegar, Dr. Anna, "Fighting Bioterrorism: Using America's Scientists and Entrepreneurs to Find Solutions," Statement of Dr. Anna Johnson-Winegar, before the Senate Committee on Commerce, Science, and Subcommittee on Science, Technology, and Space, 10 pages, Feb. 5, 2002.

Molnar, R.J., "Materials/Substrate Issues for UV Light Emitters," MIT Lincoln Laboratory, 22 pages, Apr. 9, 2001.

Muller, J., et al., "Thermal Denaturing of Bacteriorhodopsin by X-Ray Scattering from Oriented Purple Membranes," Biophysical Journal, vol. 78, pp. 3208-3217, Jun. 2000.

Nolting, "Temperature-Jump Induced Fast Refolding of Cold-Unfolded Protein," Biochemical and Biophysical Research Communications 227, pp. 903-908, 1996.

Sze. "Physics of Semiconductor Devices." pp. 763-765, John Wiley & Sons, N.Y., 1982.

Tayebati, P., et al., "Microelectromechanical tunable filter with stable half symmetric cavity," Electronics Letters, IEE Stevanage, GB, vol. 34, No. 20, pp. 1967-1968, Oct. 1998.

Tayebati, P., et. al., "Widely Tunable Fabry-Perot Filters using High Index-contrast DBRs," Design and Manufacturing of WDM Devices, Dallas, Texas, Nov. 4-5, 1997, SPIE vol. 3234, pp. 206-218, 1998.

U.S. Appl. No. 09/275,632, filed Mar. 24, 1999, entitled "Back Illuminated Heterojunction Photodiode.".

U.S. Appl. No. 10/100,298, filed Mar. 18, 2002, entitled "Spectrally Tunable Detector.".

Yang W. et al., "Back-Illuminated GAN/AlGAN Heterojunction Photodiodes With High Quantum Efficiency and Low Noise," Applied Physics Letters, vol. 73, No. 8, Aug. 24, 1998, pp. 1086-1088, XP000777678.

* cited by examiner

MULTIPLE WAVELENGTH SPECTROMETER

This Application is a continuation-in-part application of U.S. patent application Ser. No. 10/100,298, filed Mar. 18, 2002 now U.S. Pat. 7,015,457, and entitled "SPECTRALLY TUNABLE DETECTOR".

GOVERNMENT SUPPORT

This invention was made with government support under DARPA contract Number F10325. The government may have certain rights in the invention.

TECHNICAL FIELD

The present invention generally relates to spectrometers, and more particularly, to multiple wavelength spectrometers that can be used to sense more than one wavelength and/or band of wavelengths.

BACKGROUND

A number of spectrometers are known for selectively detecting light of various wavelengths. In particular, spectrometers are known for detecting individual or narrow wavelength bands of light, including wavelengths in the ultraviolet, visible, or infrared bands. In some cases, an optical filter is used in conjunction with a wide spectrum detector. The optical filter typically selects a particular wavelength of light for detection by the detector.

In many cases, the optical filters are formed from thin films that reflect or transmit a narrow band of wavelengths. Such filters are often constructed from several hundred layers of stacked narrow band filters, which collectively reflect or transmit a narrow band of wavelengths. Arrayed waveguide gratings are also commonly used. A limitation of many of these optical filter/detector combinations is that they often can only detect a single wavelength or a very narrow band of wavelengths dictated by the selectively of the optical filter. This can make it cumbersome to detect and/or monitor the spectral emission of light across a range of wavelengths and/or range of wavelength bands because numerous optical filters/detectors may be required, with each only detecting or monitoring a single or very narrow band of wavelengths.

SUMMARY

The present invention provides a multiple wavelength spectrometer that can detect multiple wavelengths, and in some cases, across multiple wavelength bands. The multiple wavelength spectrometer may include a first spectrometer and a second spectrometer, both of which may be secured relative to a substrate. In one illustrative embodiment, the first spectrometer may include a first tunable optical filter and a first detector, wherein the first tunable optical filter and the first detector are adapted to detect a first tunable range of wavelengths, and in some cases, in a first wavelength band. The second spectrometer may include a second tunable optical filter and a second detector, wherein the second tunable optical filter and the second detector are adapted to detect a second tunable range of wavelengths, and in some cases, in a second wavelength band.

In some cases, the first detector may not be sensitive to the second tunable range of wavelengths, or in some cases, the second wavelength band. Likewise, the second detector may not be sensitive to the first tunable range of wavelengths, or in some cases, the first wavelength band. In other embodiments, the first detector may not be sensitive to the second tunable range of wavelengths, or in some cases, the second wavelength band, and the first optical filter may be absorptive to the first tunable range of wavelengths, or in some cases, the first wavelength band. In any case, this may help reduce cross-talk between the first and second spectrometers, as is sometimes a difficulty experienced with conventional Fabry-Perot optical systems.

In some embodiments, either or both of the detectors may be formed in or on the common substrate, and the substrate may include read out electronics for reading the detectors and/or controlling the first and/or second tunable optical filters. In some embodiments, either or both of the detectors may be formed separately, and subsequently secured to the substrate, if desired.

In one illustrative embodiment, the first spectrometer is a Ultra Violet (UV) spectrometer that includes a UV bandpass filter configured to selectively pass at least a range of ultraviolet light, and a UV light sensitive detector positioned downstream of the UV bandpass filter to receive light passed by the UV bandpass filter. The second spectrometer may include, for example, a visible light spectrometer that includes a visible bandpass filter configured to selectively pass at least a range of visible light, and a visible light detector positioned downstream of the visible bandpass filter to receive light passed by the visible bandpass filter. In this case, the first spectrometer may be adapted to detect and/or monitor wavelengths in a first band of wavelengths (e.g. UV), and the second spectrometer is adapted to detect and/or monitor wavelengths in a second band of wavelengths (e.g. visible)

The UV bandpass filter may include, for example, a tunable Fabry-Perot mirror cavity that includes a tunable separation gap, where the UV bandpass filter is selectively tunable by adjusting the UV separation gap. Likewise, the visible bandpass filter may include, for example, a tunable Fabry-Perot mirror cavity that includes a tunable separation gap, where the visible bandpass filter is selectively tunable by adjusting the visible separation gap. It is contemplated that the UV separation gap may be different from the visible separation gap. In addition, it is contemplated that the tunable Fabry-Perot mirrors of the UV bandpass filter may be made from a different material or material system than the tunable Fabry-Perot mirrors of the visible bandpass filter. It is also contemplated that the UV light sensitive detector may be made from a different material or material system than the visible light sensitive detector, if desired.

In some embodiments, the multiple wavelength spectrometer may include a plurality of first spectrometers (e.g. Ultra Violet (UV) spectrometers) and a plurality of second spectrometers (e.g. visible light spectrometers). The first and second spectrometers may be arranged in any number of array configurations. For example, the first spectrometers may be arranged in a first linear array, and the second spectrometers may be arranged in a second linear array that is positioned adjacent to the first linear array of the first spectrometers. Alternatively, one or more of the first spectrometers may be paired with one or more of the second spectrometers to form a pixel. A number of such pixels may be arranged into a pixel array, if desired. A spectral emission may be imaged across the various arrays of first and second spectrometers for spectral analysis.

The above summary of the invention is not intended to describe each disclosed embodiment or every implementa-

BRIEF DESCRIPTION OF THE FIGURES

The invention may be more completely understood in consideration of the following detailed description of various embodiments of the invention in connection with the accompanying drawings, in which.

Figure 1:
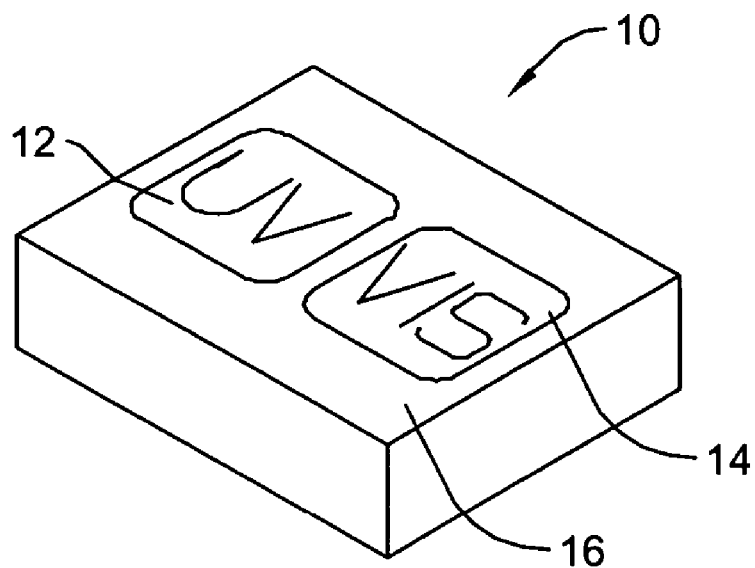
FIG. 1 is a diagrammatic perspective view of a dual wavelength spectrometer in accordance with an illustrative embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

FIG. 1 is a diagrammatic perspective view of a multiple wavelength spectrometer 10 that includes an Ultra Violet (UV) spectrometer 12 that is configured to detect at least some wavelengths that fall within the UV spectrum and a visible light spectrometer 14 that is configured to detect at least some wavelengths that fall within the visible light spectrum. The UV spectrometer 12 and visible light spectrometer 14 can be formed upon or are otherwise disposed on a substrate 16. While UV and visible light are used to illustrative multiple wavelength spectrometer 10, it is contemplated that other bands of wavelengths may be used, as desired. In addition, more than two spectrometers may be provided, where each spectrometer may be adapted to detect and/or monitor a different range of wavelengths and/or band of wavelengths.

As will be discussed in greater detail below, UV spectrometer 12 may include a UV bandpass filter that in some embodiments can be a tunable UV bandpass filter, and a detector that is sensitive to at least some of the wavelengths passed by the UV bandpass filter. Similarly, visible light spectrometer 14 may include a visible light bandpass filter that in some embodiments can be a tunable visible light bandpass filter, and a detector that is sensitive to at least some of the wavelengths passed by the visible light bandpass filter.

Figure 2:
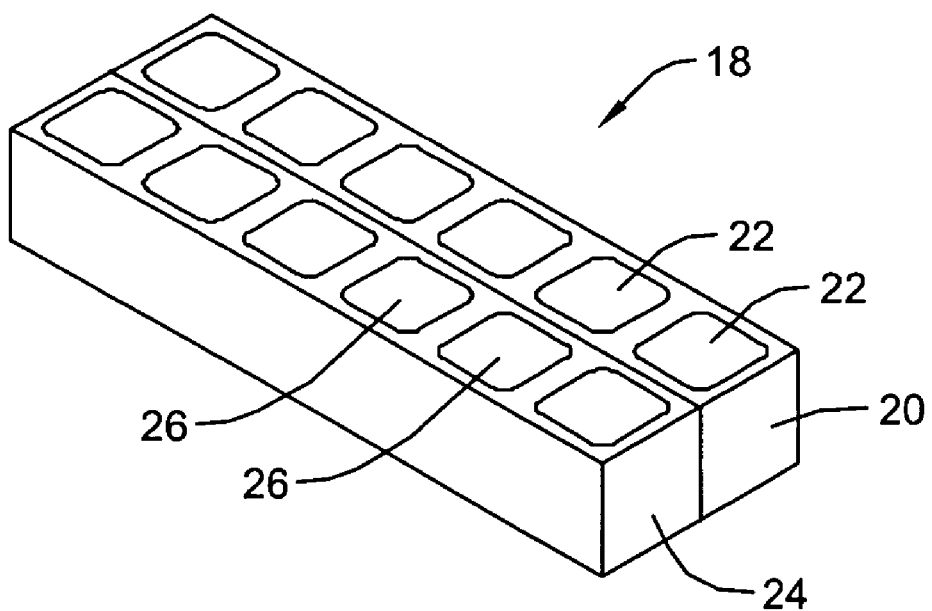
FIG. 2 is a diagrammatic perspective view of an array of spectrometers in accordance with an illustrative embodiment of the present invention.

While FIG. 1 shows multiple wavelength spectrometer 10 as having a single UV spectrometer 12 and a single visible light spectrometer 14, other embodiments may include two or more UV spectrometers and/or two or more visible light spectrometers. For example, FIG. 2 shows an array 18 that includes a first substrate 20 bearing several spectrometers 22 and a second substrate 24 bearing several spectrometers 26. In some embodiments, spectrometers 22 can be formed on substrate 20 and spectrometers 26 can be formed on substrate 22. Substrate 20 and substrate 22 can subsequently be joined to form array 18. In other embodiments, spectrometers 22 and 26 can be formed on a common substrate, as further described below.

In the illustrative embodiment, each spectrometer 22 can be a UV spectrometer, a visible spectrometer, and/or a multiple wavelength spectrometer 10 (see FIG. 1). Similarly, each spectrometer 26 can be a UV spectrometer, a visible spectrometer and/or a multiple wavelength spectrometer 10 (see FIG. 1).

Figure 3:
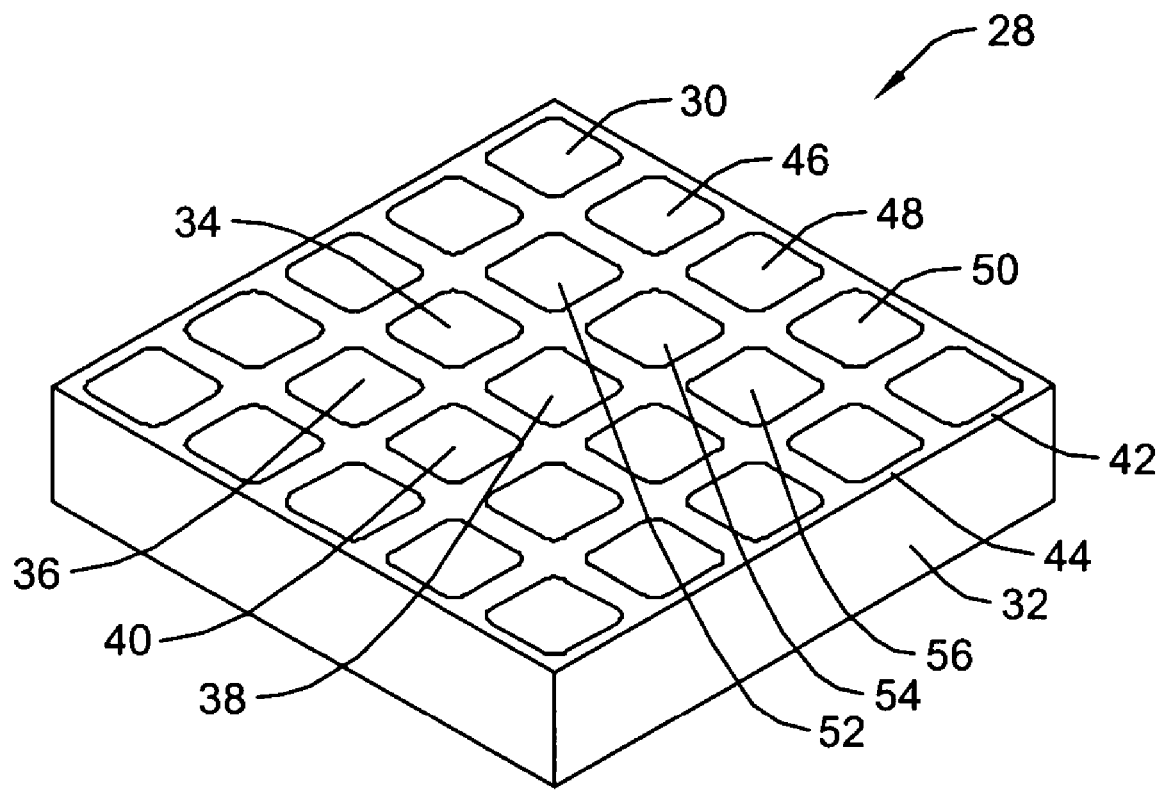
FIG. 3 is a diagrammatic perspective view of an array of spectrometers in accordance with yet another illustrative embodiment of the present invention.

Larger arrays can also be formed. FIG. 3 illustrates an array 28 that includes a plurality of spectrometers 30 formed on a substrate 32. As discussed with respect to FIG. 2, each spectrometer 30 can be a UV spectrometer, a visible spectrometer, and/or a multiple wavelength spectrometer 10 (see FIG. 1). In some embodiments, spectrometers 34 and 36 can each be configured to detect at least some wavelengths of light falling within the UV spectrum, for example, while spectrometers 38 and 40 can each be configured to detect at least some wavelengths of light falling within the visible spectrum.

In other embodiments, spectrometers 30 can be configured to provide for example a row 42 of UV spectrometers and an adjacent row 44 of visible light spectrometers. At least some of the spectrometers in row 42 can be configured or tuned to detect a similar or substantially identical portion of the UV spectrum. In some embodiments, at least some of the spectrometers in row 42 can be configured or tuned to detect differing portions of the UV spectrum. For example, in row 42, spectrometer 46 can be configured or tuned to detect a relatively higher portion (longer wavelength) of the UV spectrum, spectrometer 48 can be configured or tuned to detect a middle portion of the UV spectrum, and spectrometer 50 can be configured or tuned to detect a relatively lower portion (lower wavelength) of the UV spectrum.

Similarly, at least some of the spectrometers in row 44 can be configured or tuned to detect a similar or substantially identical portion of the visible light spectrum. In some embodiments, at least some of the spectrometers in row 44 can be configured or tuned to detect differing portions of the visible light spectrum. For example, in row 44, spectrometer 52 can be configured or tuned to detect a relatively higher portion (longer wavelength) of the visible light spectrum, spectrometer 54 can be configured or tuned to detect a middle portion of the visible light spectrum while spectrometer 56 can be configured or tuned to detect a relatively lower portion (shorter wavelength) of the visible light spectrum. To illustrate, spectrometer 52 can be sensitive to orange or yellow light, spectrometer 54 can be sensitive to green light, and spectrometer 56 can be sensitive to blue or indigo light. In some embodiments, a spectral emission may be imaged across an array of tunable spectrometers for spectral analysis. During analysis, each tunable spectrometer can be sequentially tuned across a range of wavelengths, if desired.

Figure 4:
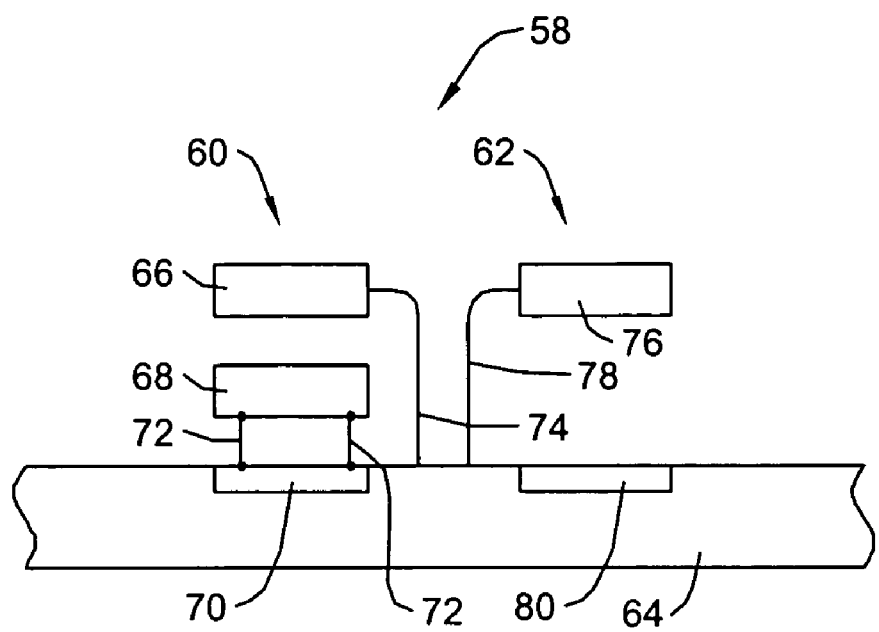
FIG. 4 is a diagrammatic side elevation view of a dual wavelength spectrometer in accordance with an illustrative embodiment of the present invention.

FIG. 4 is a diagrammatic side elevation view of an illustrative dual wavelength spectrometer 58 that includes a UV spectrometer 60 and a visible light spectrometer 62, each mounted to or formed on a substrate 64. UV spectrometer 60 includes a UV bandpass filter 66 that, in some embodiments, can be tunable to permit passage of particular ranges of wavelengths of light falling within the UV spectrum. In particular embodiments, UV bandpass filter 66 can include a tunable Fabry-Perot filter. A connector 74, which can be any suitable electrically conducting material or structure, can electrically connect UV bandpass filter 66 to substrate 64, if desired. Connector 74 can, for example, carry one or more control signals used to tune the corresponding tunable Fabry-Perot filter to a particular wavelength.

In some embodiments, UV bandpass filter 66 can prevent transmittance of at least some wavelengths of light within the visible spectrum. UV spectrometer 60 may also include a detector 68 that can detect at least some of the light passed by UV bandpass filter 66. In some cases, the detector 68 of the UV spectrometer 60 may be insensitive or blind to visible light. Detector 68 can be any suitable detector. In some embodiments, detector 68 is an AlGaN UV detector, but this is not required in all embodiments. The detector 68 is shown positioned vertically below (e.g. downstream) of the UV bandpass filter 66.

In the illustrative embodiment, substrate 64 includes read out electronics 70 that include integrated circuitry that is secured to or formed on or within substrate 64. In some embodiments, read out electronics 70 can include an amplifier to amplify any detection signal that passes from detector 68 to read out electronics 70 via connectors 72. Alternatively, or in addition to, read out electronics 70 may provide control signals to the tunable UV bandpass filter 66 via connector 74.

In the illustrative embodiment, visible light spectrometer 62 includes a visible light bandpass filter 76, which in some embodiments, can be configured or tuned to permit passage of particular wavelengths of light falling within the visible light spectrum. In particular embodiments, visible light bandpass filter 76 can be a tunable Fabry-Perot filter. A connector 78, which can be any suitable electrically conducting material or structure, can electrically connect tunable visible light bandpass filter 76 to substrate 64. Connector 78 can, for example, carry one or more control signals used to tune the corresponding tunable Fabry-Perot filter to a particular wavelength.

In the illustrative embodiment, visible light spectrometer 62 also includes a detector that can be integrally formed within the read out electronics 80 and/or substrate 64. For example, the read out electronics 80 can include a photodiode detector that is sensitive to at least some wavelengths of light falling within the visible light spectrum. Visible light bandpass filter 76 can be positioned vertically above the photodiode detector in read out electronics 80. In some cases, the photodiode detector may be sensitive to UV light, but the materials or material systems used to form the Visible light bandpass filter 76 may block any UV light from reaching the photodiode detector, thus reducing any cross-talk between the UV and visible light spectrometers.

Figure 5:
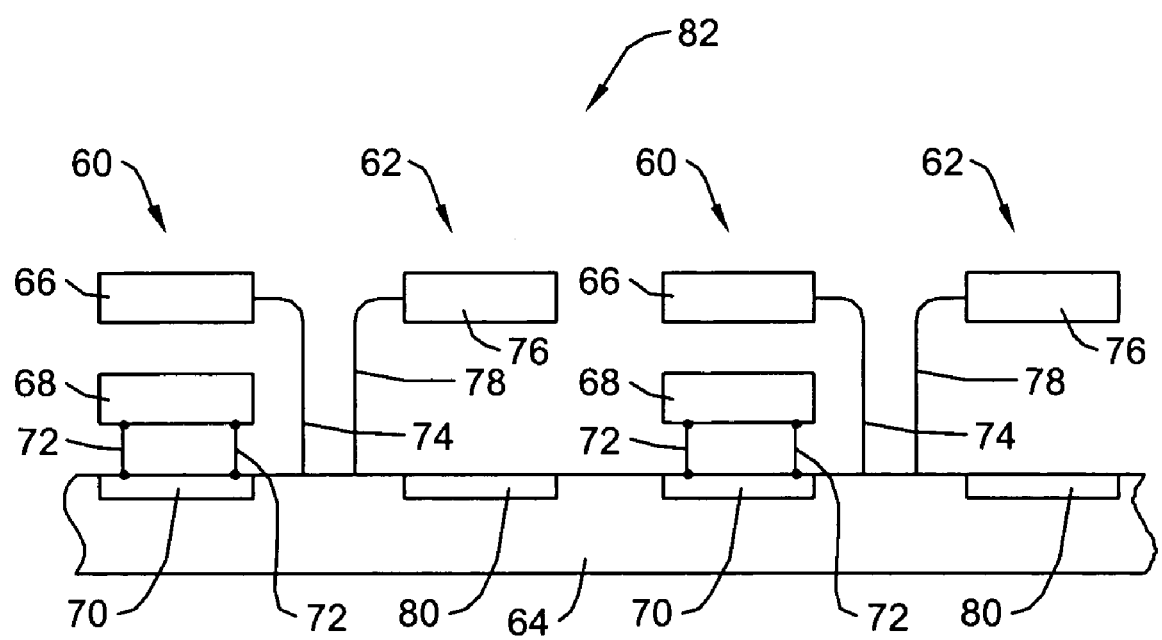
FIG. 5 is a diagrammatic side elevation view of a pair of dual wavelength spectrometers in accordance with an illustrative embodiment of the present invention.

While FIG. 4 shows a dual wavelength spectrometer 58 having a single UV spectrometer 60 and a single visible light spectrometer 62, other embodiments may employ two or more of UV spectrometers 60 and visible light spectrometers 62. FIG. 5, for example, shows a multiple wavelength spectrometer 82 including two UV spectrometers 60 and two visible light spectrometers 62. Other spectrometers that are sensitive to other wavelength ranges or wavelength bands may also be provided, if desired.

Figure 6:
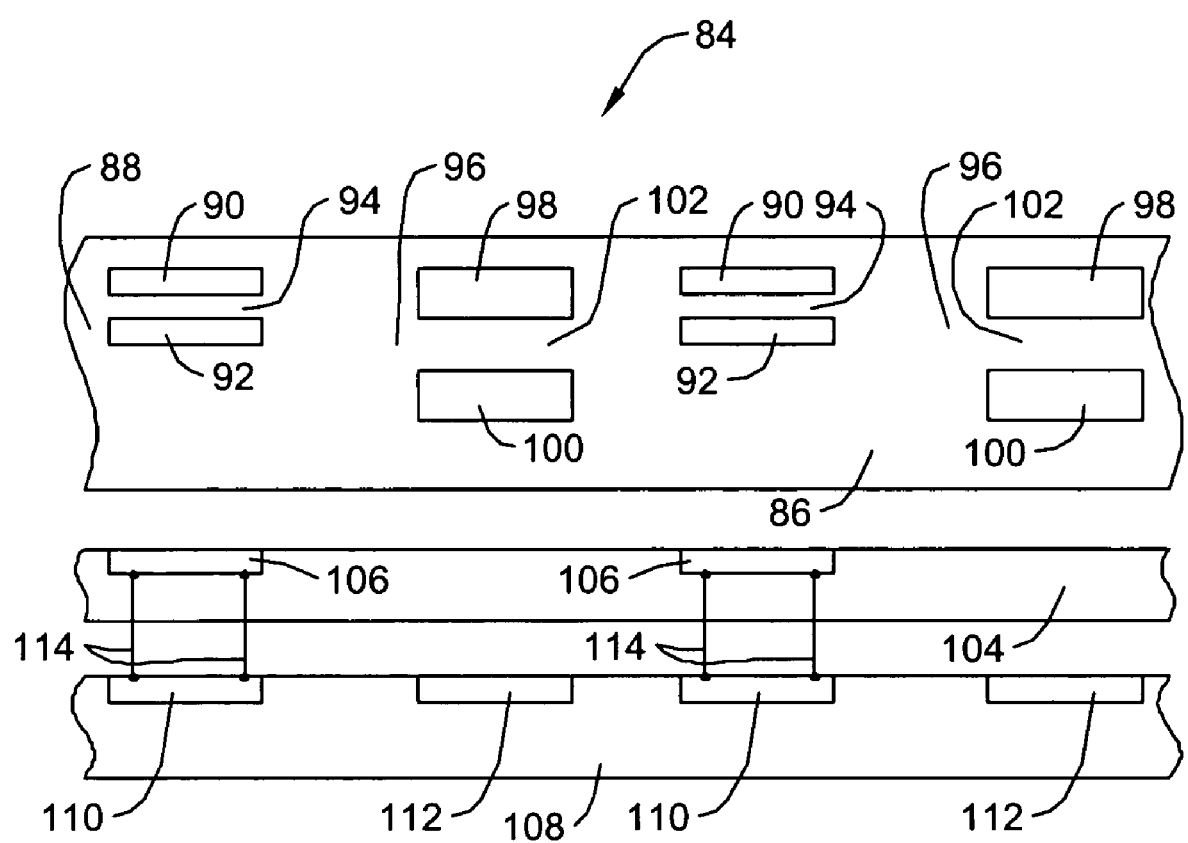
FIG. 6 is a diagrammatic side elevation view of a pair of dual wavelength spectrometers in combination with detectors and read out electronics in accordance with an illustrative embodiment of the present invention.

FIG. 6 is a schematic diagram of an illustrative detector assembly 84 that includes a bandpass filter substrate 86. The illustrative bandpass filter substrate 86 includes one or more tunable UV bandpass filters 88 and one or more tunable visible light bandpass filters 94. One illustrative method for manufacturing the bandpass filter substrate 86, with one or more UV bandpass filters 88 and one or more visible light bandpass filters 96, will be discussed in greater detail below with respect to FIGS. 7 through 18.

In the illustrative embodiment, each UV bandpass filter 88 includes an upper plate 90 and a lower plate 92, which are separated by a UV separation gap 94. It is contemplated that the upper plate 90 and lower plate 92 can be formed from any suitable material that provides the desired reflectance properties in the desired UV band.

In some embodiments, each of the upper plate 90 and the lower plate 92 can be a single layer while in other embodiments each of the upper plate 90 and the lower plate 92 may be multiple layer dielectric mirror stacks. For example, and in one illustrative embodiment, the upper plate 90 and the lower plate 92 are each formed from a number of $ZrO_2/SiO_2$ mirror pairs.

In the illustrative embodiment, the UV bandpass filter 88 can be configured or tuned to permit passage of at least some wavelengths of light that fall within the UV spectrum. For example, the UV bandpass filter 88 may have a bandpass wavelength that can be tuned within a range of about 4 nanometers to about 400 nanometers, and more particularly, within a range of about 300 nanometers to about 360 nanometers, as desired.

In one illustrative embodiment, the UV bandpass filter 88 can be tuned by adjusting the UV separation gap 94, which changes the wavelength or wavelengths of light that are permitted to pass through the UV bandpass filter 88. The UV separation gap 94 can be adjusted through the use of piezoelectric (PZT) materials, electrostatic actuation, or by any other suitable method.

Likewise, each visible light bandpass filter 96 includes an upper plate 98 and a lower plate 100, separated by a visible light separation gap 102. Upper plate 98 and lower plate 100 can be formed from any suitable material that provides the desired reflectance properties in the desired visible light band.

In some embodiments, the upper plate 98 and the lower plate 100 can include a single layer, while in other embodiments, the upper plate 98 and the lower plate 100 may include a number of mirror pairs. For example, and in one illustrative embodiment, the upper plate 98 and the lower plate 100 of the visible light bandpass filter 96 may include a number of $TiO_2/SiO_2$ mirror pairs. The $TiO_2/SiO_2$ mirror pairs tend to absorb UV light, which may help reduce cross-talk between and visible light spectrometers.

Visible light bandpass filter 96 can be configured or tuned to permit passage of at least some wavelengths of light that fall within the visible light spectrum. For example, and in some embodiments, visible light bandpass filter 96 has a bandpass wavelength that can be tuned within a range of about 400 nanometers to about 800 nanometers, and more particularly, within a range of about 400 nanometers to about 500 nanometers, as desired.

The visible light bandpass filter 96 can be tuned by adjusting the visible light separation gap 102, which changes the wavelength or wavelengths of light that are permitted to pass through the visible light bandpass filter 96. In some embodiments, visible light separation gap 102 can be adjusted through the use of piezoelectric (PZT) materials, electrostatic actuation, or by any other suitable method.

In some embodiments, detector assembly 84 may include a detector substrate 104, which includes at least some of the detectors necessary to detect light passed through the bandpass filters positioned on or within bandpass filter substrate 86. In some embodiments, detector substrate 104 can include one or more detectors 106 that are configured to detect at least some wavelengths of light falling within the UV spectrum. For example, detector substrate 104 can include one or more AlGaN UV detectors 106. It is contemplated that detectors 106 can be formed on or within detector substrate 104, formed separately and then subsequently secured to detector substrate 104, or provided in substrate 108 (see below). In the illustrative embodiment, the AlGaN UV detectors may be insensitive or blind to visible light, thereby helping to reduce any cross-talk between the UV and visible light spectrometers.

Detector assembly 84 can also include an electronics substrate 108 that includes read out electronics 110 configured to communicate with detectors 106 and, in some cases, with the tunable bandpass filters positioned on or within bandpass filter substrate 86. Read out electronics 112 may also include one or more detectors that are configured to detect at least some of the light that passes through, for example, visible light bandpass filters 96. As discussed previously, read out electronics 110 can include amplifiers and/or other circuitry that is adapted to amplify a detection signal passing from one or more of the detectors, and/or provide one or more control signals to the detectors and/or the tunable bandpass filters, depending on the application.

In one illustrative embodiment, substrate 108 may be silicon, and may include a silicon based detector or detector array to detect light in, for example, the visible wavelength range. The silicon substrate 108 may also include readout circuitry (ROIC) 112 that, for example, is electrically coupled to UV detector 106. To provide enhanced UV detection sensitivity, and as noted above, UV detector 106 may be an AlGaN detector or detector array, which may be bonded to the silicon substrate 108 and electrically connected to the ROIC 112. The AlGaN detector or detector array 106 may provide high UV sensitivity, with little or no visible light sensitivity because the visible light may be below the band gap for excitation of the AlGaN detector or detector array 106.

In contrast, the silicon based detector or detector array may have high sensitivity to visible wavelengths, and may be relatively insensitive to UV radiation, even more so when the corresponding Fabry-Perot filter includes films that include UV absorbing properties, such as $TiO_2$. Thus, and through the use of two compatible technologies, good spectral differentiation of signals in the UV and visible spectral ranges can be achieved, which may help reduce cross-talk between the first and second spectrometers.

FIGS. 7 through 18 show an illustrative method of forming an illustrative bandpass filter substrate, such as bandpass substrate 86 of FIG. 6. This method is to be considered merely as illustrative, as other manufacturing methods can also be employed, as desired. For illustrative purposes only, FIGS. 7 through 18 show the manufacture of an illustrative bandpass filter substrate that has a single UV bandpass filter 88 and a single visible light bandpass filter 96. However, it is contemplated that a number of bandpass filters, effective at various wavelengths and/or wavelength bands, may be formed in a like manner. In addition, it is contemplated that numerous other methods may be used to form a multiple wavelength bandpass filter in accordance with the present invention.

Figure 7:
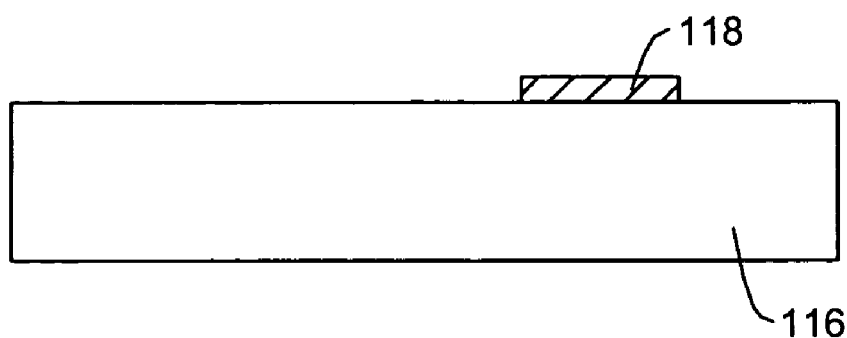
FIGS. 7 through 18 show an illustrative method of forming a dual wavelength bandpass filter in accordance with an illustrative embodiment of the present invention.

As shown in FIG. 7, manufacture of the bandpass filter substrate begins by providing a substrate 116 that can be formed of any suitable material. In some embodiments, substrate 116 can be formed from a material that is at least substantially transparent to ultraviolet and visible light, such as glass or Pyrex®.

In the illustrative embodiment, one or more mirror layers are formed on substrate 116 and patterned to form a lower plate 118 that is adapted for reflecting visible light. By adapted, it is meant that lower plate 118 is configured to function within a particular bandpass filter. In the illustrated embodiment, lower plate 118 forms a bottom mirror or plate for a visible light bandpass filter 96 (see, for example, FIG. 6). The lower plate 118 may include a number of layers, such as alternating layer pairs of lower and higher refractive index materials to form a mirror. In the illustrative embodiment, the lower plate 118 may be formed by a number of $TiO_2/SiO_2$ layer pairs.

Figure 8:
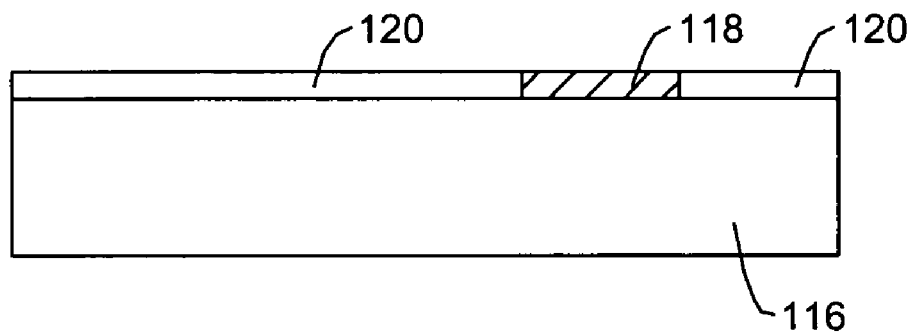

Next, and as shown in FIG. 8, a support layer 120 may be provided atop substrate 116, on either side of lower plate 118. Support layer 120 can be formed of any suitable material. In some embodiments, support layer 120 can be formed of a material that is at least substantially transparent to ultraviolet light, such as $SiO_2$.

Figure 9:
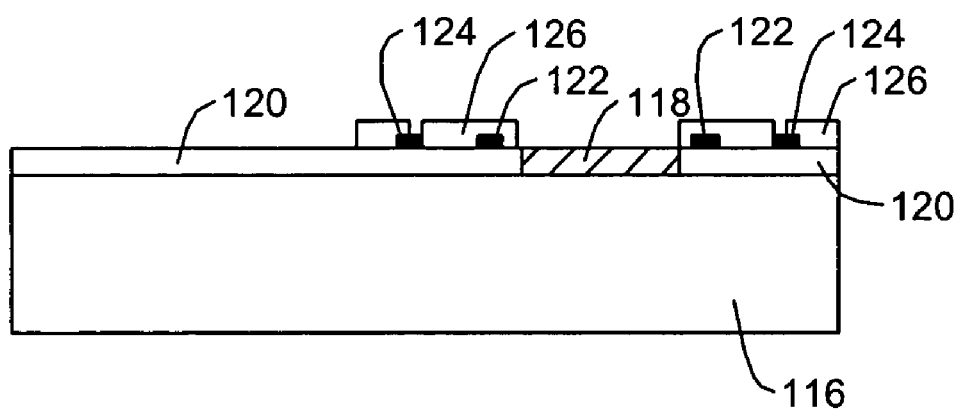

Next, and as shown in FIG. 9, bottom electrodes 122 and bottom conducting pads 124 are formed. A dielectric or other protecting layer 126 is then provided over the bottom electrodes 122 and bottom conducting pads 124. Subsequently, the protective layer 126 may be patterned to expose bottom conducting pads 124 as shown.

Figure 10:
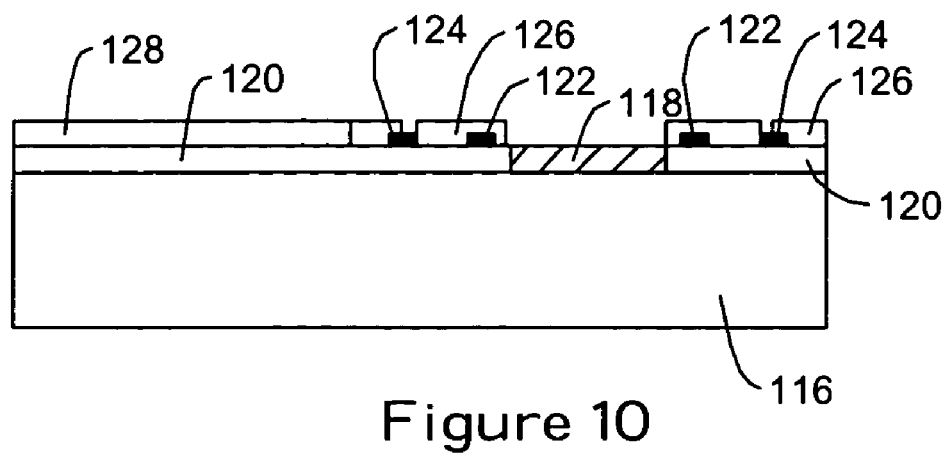

Next, and as shown in FIG. 10, a support layer 128 may be provided over support layer 120 in an area that will provide support for a bottom mirror or plate for the UV bandpass filter 88 (see FIG. 6). Support layer 128 can be formed of any suitable material. In some embodiments, support layer 128 is formed of a material that is at least substantially transparent to ultraviolet light, such as $SiO_2$.

Figure 11:
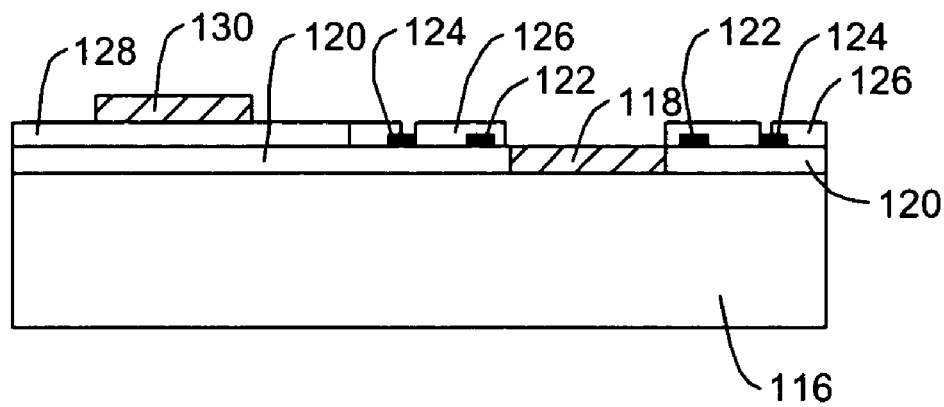

Next, and as shown in FIG. 11, one or more mirror layers are formed on support layer 128 and patterned to form a lower plate 130 that is adapted for reflecting ultra violet light. In the illustrated embodiment, lower plate 130 forms a bottom mirror or plate for a UV light bandpass filter 88 (see, for example, FIG. 6). The lower plate 130 may include a number of layers, such as alternating layer pairs of lower and higher refractive index materials to form a mirror. In the illustrative embodiment, the lower plate 130 may be formed by a number of $ZrO_2/SiO_2$ layer pairs.

Figure 12:
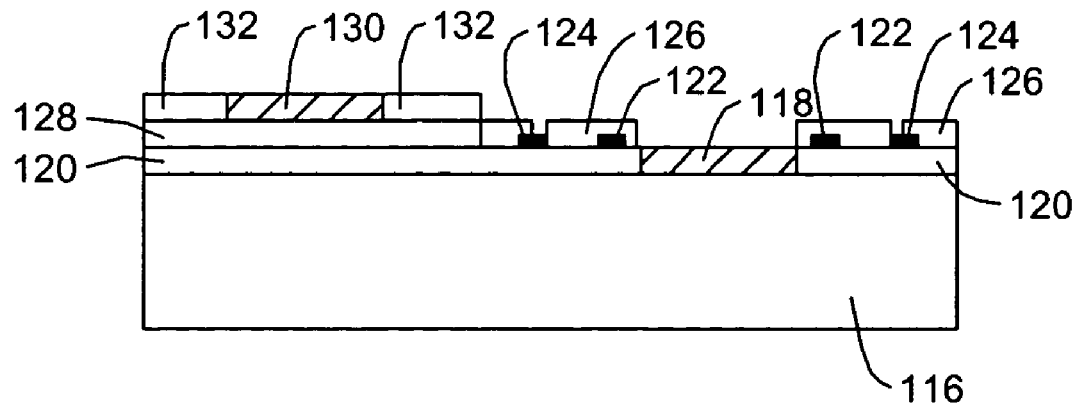

Next, and as shown in FIG. 12, a support layer 132 may be provided atop support layer 128, on either side of lower plate 130. Support layer 120 can be formed of any suitable material. In some embodiments, support layer 120 can be formed of a material that is at least substantially transparent to ultraviolet light, such as $SiO_2$.

Figure 13:
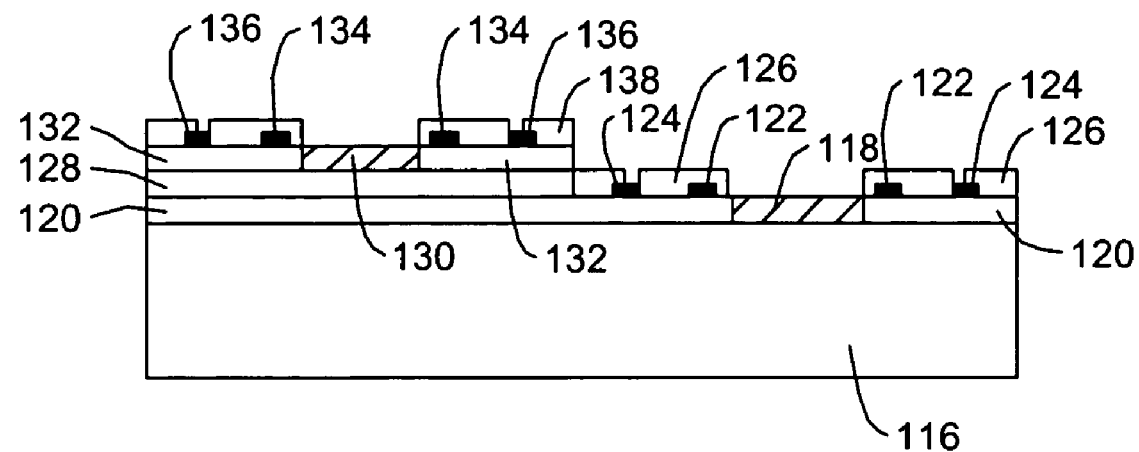

Next, and as shown in FIG. 13, bottom electrodes 134 and bottom conducting pads 136 may be formed. A dielectric or other protecting layer 138 can be provided and subsequently patterned to expose bottom conducting pads 136 as shown.

Figure 14:
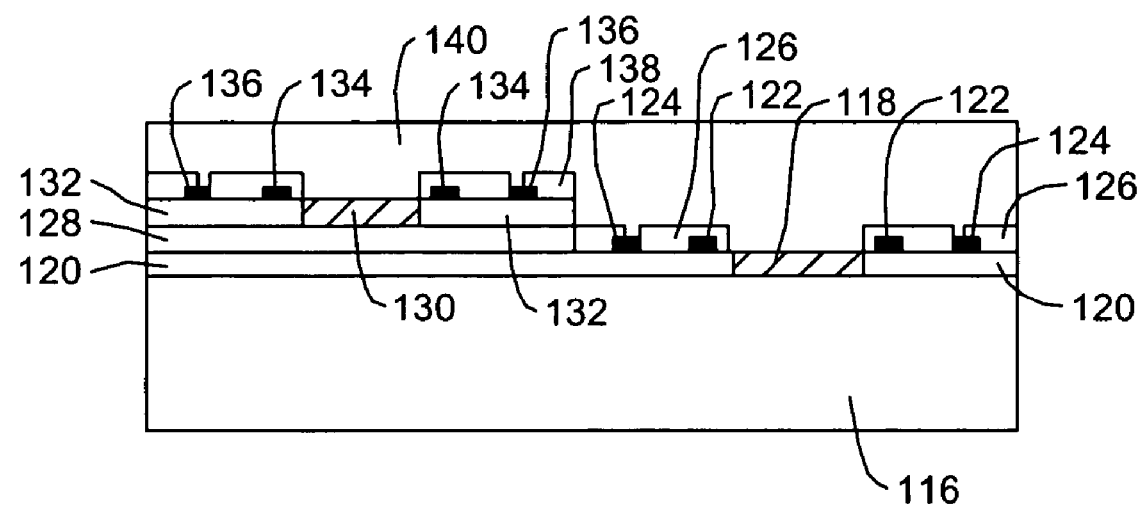

Next, and as shown in FIG. 14, a sacrificial layer 140 may be provided. Sacrificial layer 140 can be formed of any suitable material that can be selectively etched or removed later. In some embodiments, sacrificial layer 140 may be formed of a polyimide. As shown in FIG. 14, sacrificial layer 140 can have a first depth or thickness over lower plate 130 and a second, greater depth or thickness over lower plate 118. In some embodiments, the top surface of the sacrificial layer 140 may be planarized, such as by Chemical Mechanical Polishing (CMP).

Figure 15:
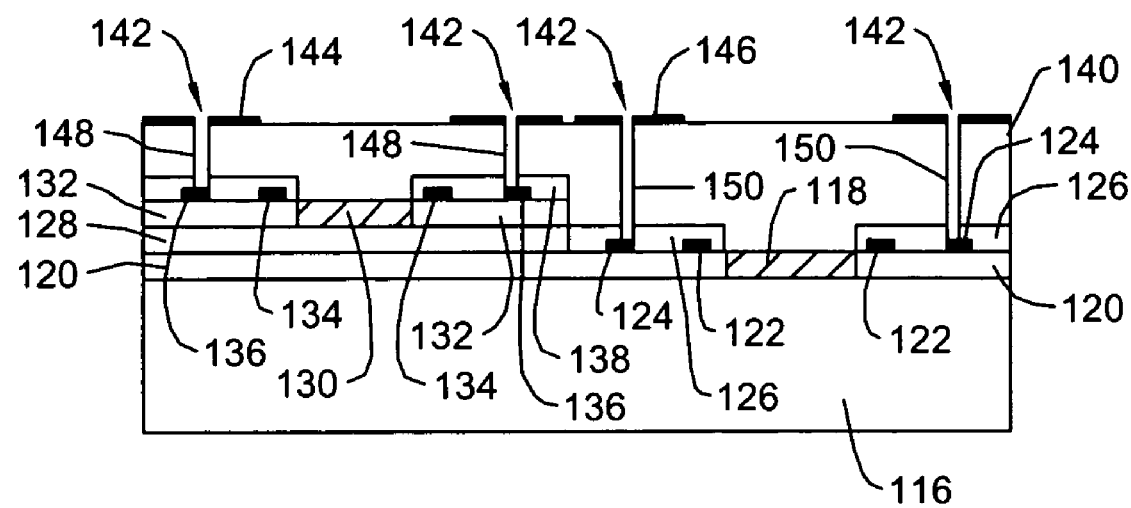

Next, and as shown in FIG. 15, holes 142 may be etched through sacrificial layer 140 down to conductive pads 124 and 136. A metal layer may then be deposited and patterned to form top electrode regions 144 and 146, respectively. In the illustrative embodiment, the metal may extend into holes 142 to form an electrical connection 148 between bottom connecting pads 136 and top electrode regions 144 and to form an electrical connection 150 between bottom connecting pads 124 and top electrode regions 146.

Figure 16:
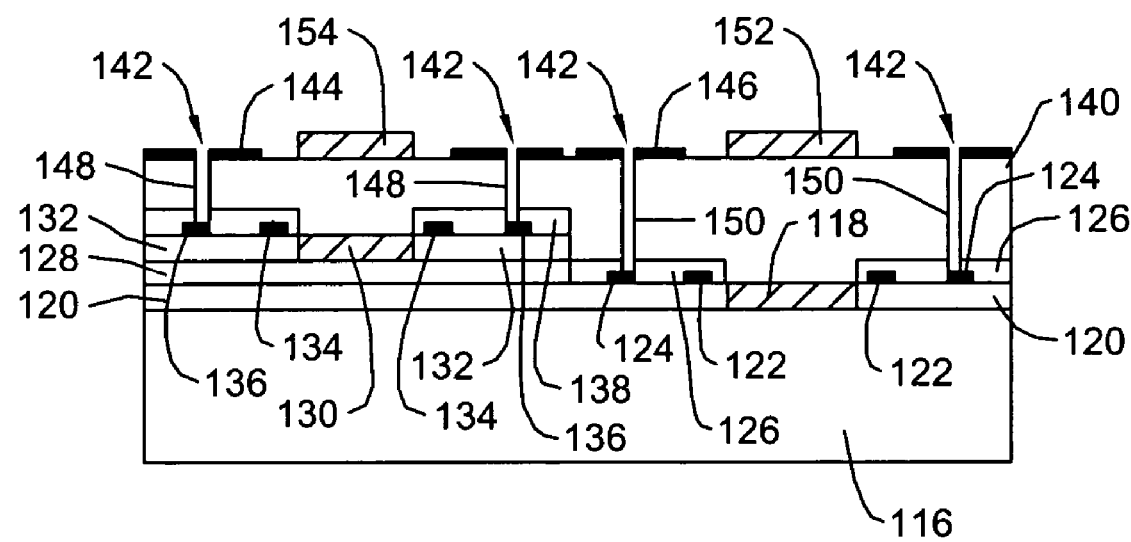

Next, and as shown in FIG. 16, one or more mirror layers are formed on sacrificial layer 140 and are patterned to form an upper plate 152 that is adapted for visible light. In the illustrated embodiment, upper plate 152 forms an upper mirror or plate for the visible light bandpass filter 96 (see FIG. 6). Again, the upper plate 152 may include, for example, a number of $TiO_2/SiO_2$ mirror pairs.

Next, one or more mirror layers may be formed on sacrificial layer 140 and are patterned to form an upper plate 154 that is adapted for ultraviolet light. In the illustrated embodiment, upper plate 154 forms an upper mirror or plate for the bandpass filter 88 (see FIG. 6). The upper plate 154 may include, for example, a number of $ZrO_2/SiO_2$ mirror pairs.

Figure 17:
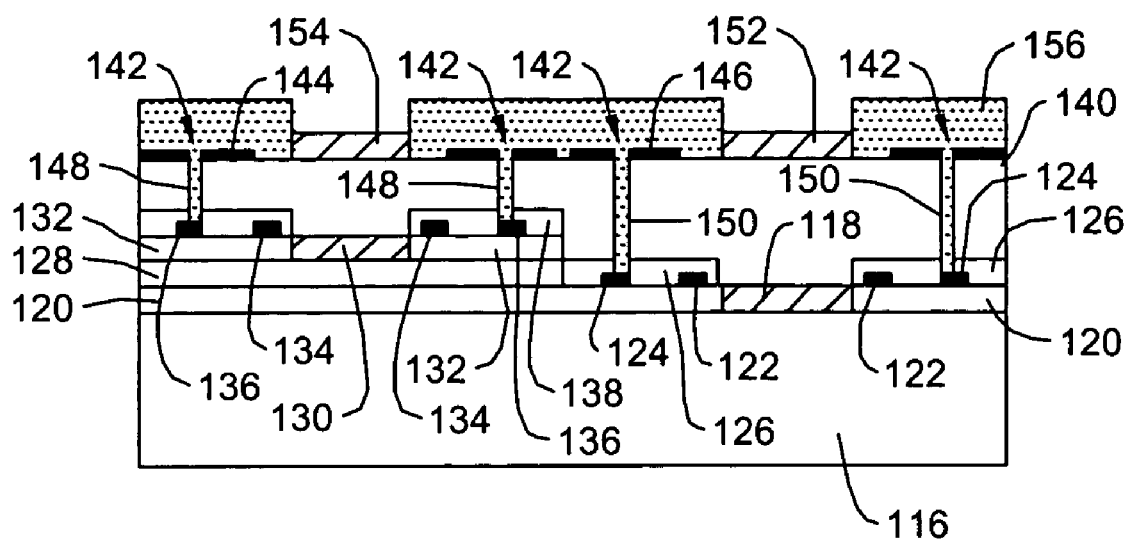
Figure 18:
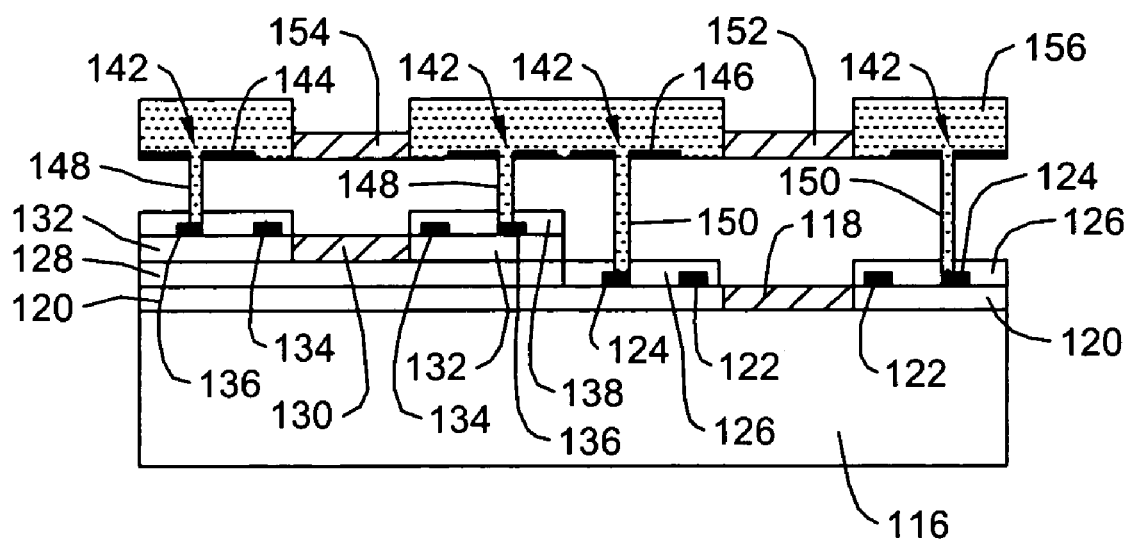

Next, and as shown in FIG. 17, a support layer 156 is provided over the structure. A buffer layer can be provided first if desired in order to help bond the layers together. Support layer 156 is patterned to expose upper plate 152 and upper plate 154. In the illustrative embodiment, support layer 156 bonds to upper plate 152 and upper plate 154, and fills holes 142 to provide structural support. Finally, and as shown in FIG. 18, sacrificial layer 140 is removed thereby releasing the structure.

The bandpass filter substrate 86 (see FIG. 6) produced in accordance with the illustrative method illustrated in FIGS. 7 through 18 can be combined with detector substrate 104 and electronics substrate 108 to form multiple wavelength spectrometer 10, as described above.

The multiple wavelength spectrometers of the present invention can be used for a wide variety of uses. For example, the multiple wavelength spectrometers may be used to detect or monitor multiple optical "channels" in an optical fiber network. In addition, the multiple wavelength spectrometers may be used to monitor the spectral emission from power plants and/or engines to provide a level of combustion monitoring and control. In another example, the multiple wavelength spectrometers of the present invention may be used to efficiently detect and/or monitor the spectral emission of fluorescence emitted by one or more excited biological materials.

Figure 19:
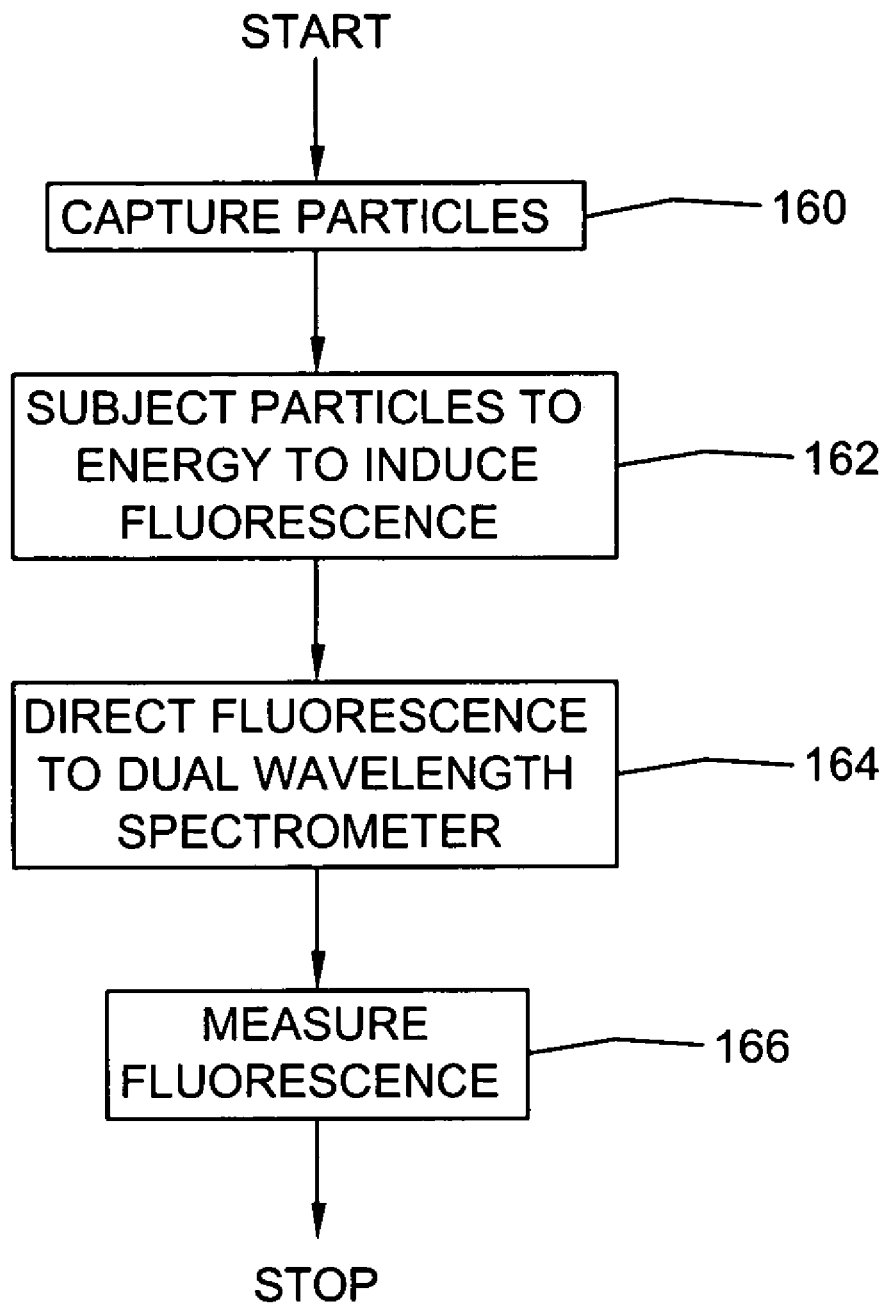
FIG. 19 is a flowchart showing an illustrative use of a multiple wavelength bandpass filter in accordance with the present invention.

FIG. 19 is a flowchart showing a method for using the multiple wavelength spectrometers of the present invention to detect and/or monitor the spectral emission of fluorescence emitted by one or more excited biological materials. The method begins at block 160, which involves capturing one or more particles to be tested, including one or more biological particles. In some embodiments, the particles can be airborne particles, but this is not required in all embodiments. Next, at block 162, the captured particles are subjected to energy such as an excitation light beam that is sufficient to induce fluorescence in at least some of the biological particles in the sample. At block 164, at least some of the induced fluorescence is provided to a multiple wavelength spectrometer. In the illustrative embodiment, the multiple wavelength spectrometer includes a UV spectrometer and a visible light spectrometer, as described above. Next, at block 166, at least some of the induced fluorescence is measured using the UV spectrometer and the visible light spectrometer. The UV spectrometer and the visible light spectrometer may be operated simultaneously, or sequentially, as desired.

Figure 20:
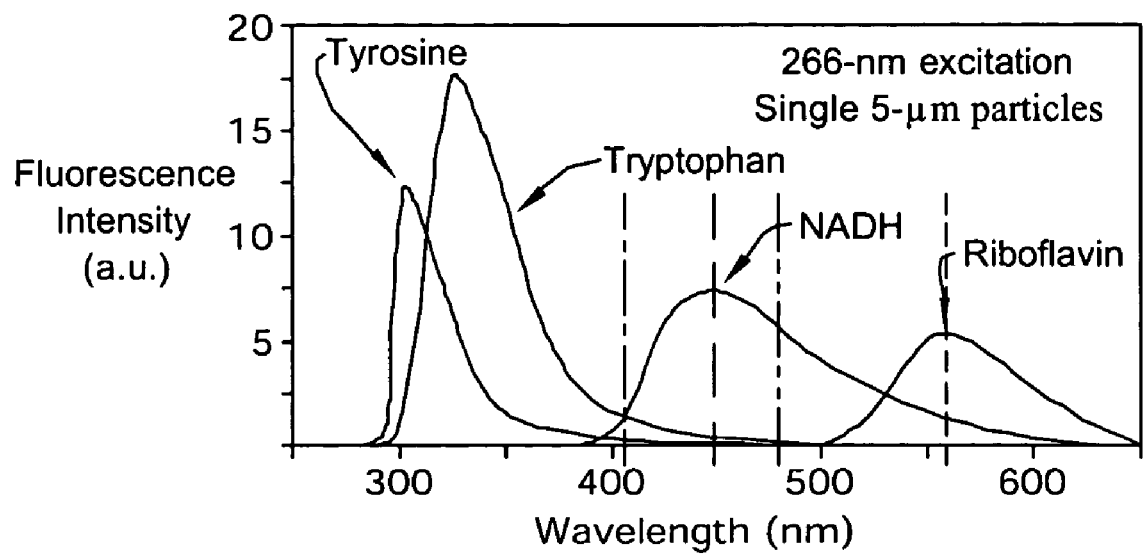
FIGS. 20 and 21 are graphs showing an illustrative use of a multiple wavelength spectrometer in accordance the invention.
Figure 21:
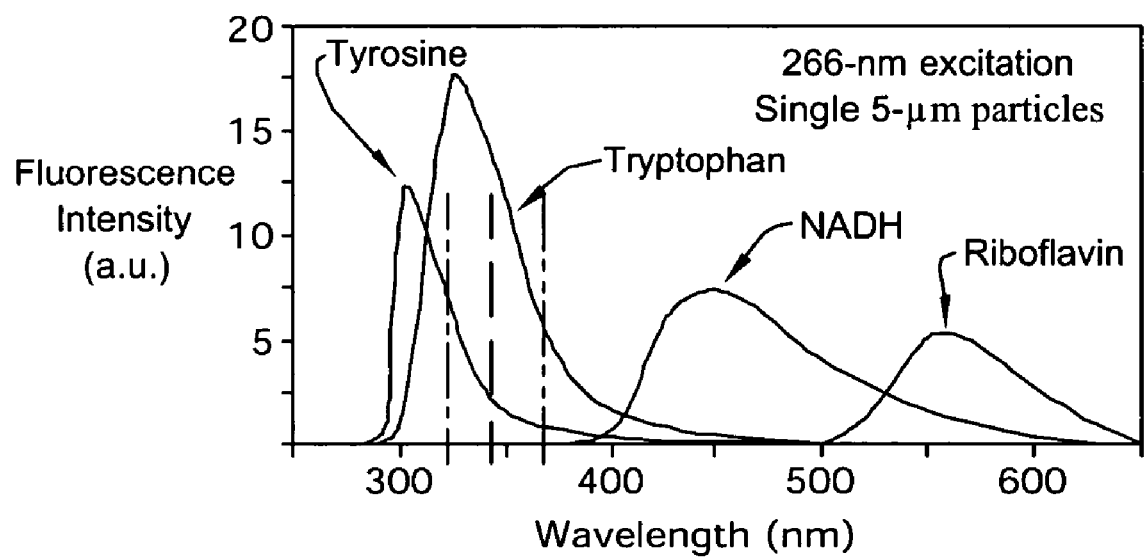

FIGS. 20 and 21 show fluorescence intensities versus wavelength for several typical bioaerosol components that are excited by an excitation wavelength of 266 nanometers. As tested, the particles were about 5 microns in diameter. In particular, tyrosine, tryptophan, NADH and riboflavin were tested. As can be seen, tyrosine provides a peak fluorescence close to 300 nanometers, tryptophan provides a somewhat more expanded peak centered just under 350 nanometers, NADH provides a lower but broad peak centered around 450 nanometers and riboflavin provides a low and broad peak centered around 575 nanometers.

FIG. 20 shows testing results in the visible spectrum. In particular, fluorescence was detected at a wavelength of about 405 nanometers, about 450 nanometers, about 480 nanometers and about 560 nanometers. As can be seen by comparing these wavelengths to the fluorescence intensity versus wavelength graph, it appears that the first three detected wavelengths can be considered as indicating the presence of NADH while the final detected wavelength can be considered as indicating the presence of riboflavin.

FIG. 21 shows testing results in the ultraviolet spectrum. In particular, excitation fluorescence was detected at a wavelength of about 312 nanometers, about 340 nanometers and about 368 nanometers. As can be seen by comparing these wavelengths to the fluorescence intensity versus wavelength graph, it appears that the first detected wavelength can be considered as indicating the presence of tyrosine while the remaining two detected wavelengths can be considered as indicating the presence of tryptophan. These results indicate that by providing a multiple wavelength detector, as disclosed herein, more of the fluorescence spectrum can be analyzed in a shorter period of time, thereby allowing a more accurate and/or more efficient detection system.

The invention should not be considered limited to the particular examples described above, but rather should be understood to cover all aspects of the invention as set out in the attached claims. Various modifications, equivalent processes, as well as numerous structures to which the invention can be applicable will be readily apparent to those of skill in the art upon review of the instant specification.

What is claimed is:

1. A spectrometer, comprising:
    a substrate;
    a first spectrometer secured relative to the substrate, the first spectrometer comprising a first tunable optical filter and a first detector, the first tunable optical filter and the first detector adapted to detect a first tunable range of wavelengths; and a second spectrometer secured relative to the substrate, the second spectrometer comprising a second tunable optical filter and a second detector, the second tunable optical filter and the second detector adapted to detect a second tunable range of wavelengths, wherein the first tunable range of wavelengths is different from the second tunable range of wavelengths.

2. A spectrometer according to claim 1 wherein the first spectrometer is a UV light spectrometer that includes a tunable UV bandpass filter and a UV sensitive detector positioned in proximity to the UV bandpass filter.

3. A spectrometer according to claim 1 wherein the second spectrometer is a visible light spectrometer that includes a tunable visible bandpass filter and a visible light sensitive detector positioned in proximity to the visible bandpass filter.

4. A spectrometer according to claim 2 wherein the second spectrometer is a visible light spectrometer that includes a tunable visible bandpass filter and a visible light sensitive detector positioned in proximity to the visible bandpass filter.

5. A spectrometer according to claim 1 wherein the substrate includes read out electronics that are electrically coupled to the first detector and the second detector.

6. A spectrometer according to claim 1 wherein the first spectrometer is positioned adjacent the second spectrometer to receive different parts of a common light beam.

7. A spectrometer according to claim 2, wherein the tunable UV bandpass filter comprises a Fabry-Perot filter configured to pass a selectable range of wavelengths of light, the selectable range of wavelengths of light falling within a range of about 4 to about 400 nanometers.

8. A spectrometer according to claim 7, wherein the selectable range of wavelengths falls within a range of about 300 to about 360 nanometers.

9. A spectrometer according to claim 3, wherein the visible light bandpass filter comprises a Fabry-Perot filter configured to pass a selectable range of wavelengths of light, the selectable range of wavelengths of light falling within a range of about 400 to about 800 nanometers.

10. A spectrometer according to claim 9, wherein the selectable range of wavelengths falls within a range of about 400 to about 500 nanometers.

11. A spectrometer according to claim 4, wherein the UV sensitive detector is relatively insensitive to visible light.

12. A spectrometer according to claim 11, wherein the UV sensitive detector comprises an AlGaN detector located adjacent to the substrate.

13. A spectrometer according to claim 4, wherein the visible light sensitive detector comprises a photodiode formed within or on the substrate.

14. A spectrometer according to claim 4, wherein the UV tunable bandpass filter is positioned above the UV sensitive detector.

15. A spectrometer according to claim 4, wherein the visible light bandpass filter is positioned above the visible light sensitive detector.

16. A spectrometer according to claim 1, further comprising a plurality of first spectrometers and a plurality of second spectrometers arranged in an array.

17. A spectrometer according to claim 16, wherein the plurality of first spectrometers are arranged in a first linear array and the plurality of second spectrometers are arranged in a second linear array positioned adjacent the first linear array.

18. A spectrometer according to claim 17, wherein at least one of the plurality of first spectrometers and at least one of the plurality of second spectrometers are paired in the array.

19. A spectrometer, comprising:
a UV bandpass filter configured to selectively pass at least a range of ultraviolet light, the UV bandpass filter comprising a first plate and a second plate that are separated by a first separation gap, where the UV bandpass filter is selectively tunable by adjusting the first separation gap;
a UV light sensitive detector positioned downstream of the UV bandpass filter to receive light passed by the UV bandpass filter;
a visible bandpass filter configured to selectively pass at least a range of visible light, the visible bandpass filter comprising a third plate and a fourth plate that are separated by a second separation gap, where the visible bandpass filter is selectively tunable by adjusting the second separation gap; and
a visible light sensitive detector positioned downstream of the visible bandpass filter to receive light passed by the visible bandpass filter.

20. A spectrometer according to claim 19, wherein the first plate is at least partially reflective and comprises a $ZrO_2/SiO_2$ multilayer dielectric mirror stack.

21. A spectrometer according to claim 19, wherein the second plate is at least partially reflective and comprises a $ZrO_2/SiO_2$ multilayer dielectric mirror stack.

22. A spectrometer according to claim 19, wherein the UV bandpass filter is tunable to bandpass wavelengths that fall within the range of about 300 nanometers to about 360 nanometers.

23. A spectrometer according to claim 19, wherein the UV light sensitive detector comprises an AlGaN detector.

24. A spectrometer according to claim 19, further comprising an amplifier in communication with the UV light sensitive detector.

25. A spectrometer according to claim 19, wherein the third plate is at least partially reflective and comprises a $TiO_2/SiO_2$ multilayer dielectric mirror stack.

26. A spectrometer according to claim 19, wherein the fourth plate is at least partially reflective and comprises a $TiO_2/SiO_2$ multilayer dielectric mirror stack.

27. A spectrometer according to claim 19, wherein the visible light bandpass filter is tunable to bandpass wavelengths that fall within the range of about 400 nanometers to about 500 nanometers.

28. A spectrometer according to claim 19, wherein the UV bandpass filter, the UV light sensitive detector, the visible bandpass filter, and the visible light sensitive detector are secured to a common substrate.

29. A multiple wavelength spectrometer, comprising:
a plurality of first bandpass filters each configured to selectively pass at least a first range of wavelengths, each of the first bandpass filters comprising an upper plate and a lower plate that are separated by a first separation gap, where the first bandpass filters are selectively tunable by adjusting the first separation gap;
a plurality of first light detectors positioned downstream of the plurality of first bandpass filters to receive light passed by the first bandpass filters;
a plurality of second bandpass filters each configured to selectively pass at least a second range of wavelengths, wherein the first range of wavelengths is different from the second range of wavelengths, each of the second bandpass filters comprising an upper plate and a lower plate that are separated by a second separation gap, where the second bandpass filters are selectively tunable by adjusting the second separation gap; and a plurality of second light detectors positioned downstream of the plurality of second bandpass filters to receive light passed by the second bandpass filters.

30. A multiple wavelength spectrometer according to claim 29, wherein at least some of the plurality of first bandpass filters are configured to selectively pass a common subset of wavelengths within the first range of wavelengths.

31. A multiple wavelength spectrometer according to claim 29, wherein at least some of the plurality of first bandpass filters are configured to selectively pass a different subset of wavelengths within the first range of wavelengths.

32. A multiple wavelength spectrometer according to claim 29, wherein at least some of the plurality of second bandpass filters are configured to selectively pass a common subset of wavelengths within the second range of wavelengths.

33. A multiple wavelength spectrometer according to claim 29, wherein at least some of the plurality of second bandpass filters are configured to selectively pass a different subset of wavelengths within the second range of wavelengths.

34. A multiple wavelength spectrometer according to claim 29, wherein at least some of the upper plates and at least some of the lower plates of the first bandpass filters are at least partially reflective and comprise $ZrO_2/SiO_2$ multilayer dielectric mirror stacks.

35. A multiple wavelength spectrometer according to claim 29, wherein at least some of the upper plates and at least some of the lower plates of the second bandpass filters are at least partially reflective and comprise $TiO_2/SiO_2$ multilayer dielectric mirror stacks.

36. A method of detecting biological materials within a sample, comprising steps of:

subjecting the sample to an energy source to induce fluorescence in at least some of the biological material within the sample; and simultaneously measuring at least some of the induced fluorescence using a UV light spectrometer comprising a Fabry-Perot filter tuned to pass UV light and a UV detector blind or substantially blind to visible light, and a visible light spectrometer comprising a Fabry-Perot filter tuned to absorb or otherwise block or substantially block UV light and a visible light detector.

37. A spectrometer for detecting a first wavelength of light and a second wavelength of light, comprising:

a first spectrometer including a first detector downstream of a first optical filter, the first detector being sensitive to the first wavelength of light but not substantially sensitive to the second wavelength of light; and a second spectrometer including a second detector downstream of a second optical filter, the second optical filter substantially absorbing the first wavelength of the light.

38. A spectrometer according to claim 37 wherein the first wavelength of light is in the UV band.

39. A spectrometer according to claim 38 wherein the second wavelength of light is in the visible band.

40. A spectrometer according to claim 39 wherein the first detector is an AlGaN detector.

41. A spectrometer according to claim 40 wherein the second detector is a silicon based detector.

42. A spectrometer according to claim 41 wherein the first optical filter includes $ZrO_2$.

43. A spectrometer according to claim 42 wherein the second optical filter includes $TiO_2$.

44. A spectrometer according to claim 1 wherein the first detector is insensitive or substantially insensitive to the second tunable range of wavelengths and the second tunable optical filter blocks or substantially blocks transmission of the first tunable range of wavelengths.

* * * * *